(12) United States Patent
Classon

(10) Patent No.: US 6,199,189 B1
(45) Date of Patent: Mar. 6, 2001

(54) METHOD, SYSTEM, APPARATUS, AND PHONE FOR ERROR CONTROL OF GOLAY ENCODED DATA SIGNALS

(75) Inventor: Brian Keith Classon, Streamwood, IL (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/109,349

(22) Filed: Jun. 30, 1998

(51) Int. Cl.[7] .................................................. H03M 13/03
(52) U.S. Cl. .......................................................... 714/783
(58) Field of Search .................................. 714/783, 780, 714/758, 796, 781, 752

(56) References Cited

U.S. PATENT DOCUMENTS

| | | | |
|---|---|---|---|
| 4,389,677 | 6/1983 | Rushby et al. | 358/280 |
| 4,397,022 | * 8/1983 | Weng et al. | 714/752 |
| 4,414,667 | 11/1983 | Bennett | 714/752 |
| 4,613,860 | 9/1986 | Currie et al. | 340/825.57 |
| 4,648,091 | 3/1987 | Gaijar | 714/752 |
| 4,926,169 | 5/1990 | Tong et al. | 340/825.57 |
| 5,548,684 | 8/1996 | Wang et al. | 395/21 |
| 5,606,569 | 2/1997 | MacDonald et al. | 714/758 |
| 5,805,613 | * 9/1998 | Beery et al. | 714/752 |
| 5,838,267 | * 11/1998 | Wang et al. | 341/94 |
| 5,968,199 | * 10/1999 | Khayrallah et al. | 714/783 |

OTHER PUBLICATIONS

Amrani et al., Efficient Bounded–Distance Decoding of the Hexacode and assoicated Decoders for the Leech Lattice and the Golay Code, IEEE., p. 400, 1994.*

Ran et al., A Cyclic [6, 3, 4] Group Code and the Hexacode over GF(4), IEEE, pp. 1250–1253, Jun. 1996.*

Amrani, Ofer, Yair Be'ery, Alexander Vardy, Feng–Wen Sun, and Henk C.A. van Tilborg, "The Leech Lattice and the Golay Code: Bounded–Distance Decoding and Multilevel Constructions",IEEE Transactions on Information Theory, vol. 40, No. 4, Jul. 1994, pp. 1030–1043.

Vardy, Alexander, "Even More Efficient Bounded–Distance Decoding of the Hexacode, the Golay Code, and the Leech Lattice", IEEE Transactions of Information Theory, vol. 41, No. 5, Sep. 1995, pp. 1495–1499.

Vardy, Alexander and Yair Be'ery, "More Efficient Soft Decoding of the Golay Codes", IEEE Transactions of Information Theory, vol. 37, No. 3, May 1991, pp. 667–672.

Costello, Daniel J., "Construction of Good Convolutional Codes", Prentice–Hall, Inc., Englewood Cliffs, New Jersey, 1983, p. 329.

* cited by examiner

*Primary Examiner*—Albert DeCady
*Assistant Examiner*—Shelly A Chase
(74) *Attorney, Agent, or Firm*—K. Cyrus Khosravi; Douglas D. Fekete

(57) ABSTRACT

The present invention provides a method (400), error control system (200), phone (209) and error control apparatus (208) including a hexacode-based Golay decoder (210) adapted to receive values defining Golay encoded data signals and to generate a estimate of original input data signals (216) and a plurality of metrics associated with Golay encoded data signals, and an error detection circuit (212) coupled to the hexacode-based Golay decoder (210) for comparing the plurality of metrics and providing an error detection flag (214).

13 Claims, 2 Drawing Sheets

METHOD, SYSTEM, APPARATUS, AND PHONE FOR ERROR CONTROL OF GOLAY ENCODED DATA SIGNALS

BACKGROUND OF THE INVENTION

It is well known that channel coding can provide error correction capability, error detection capability, or both. A channel decoder that can detect errors passes this information to an error handling routine, which typically either signals for retransmission of an erroneous block of data, or attempts some form of error concealment.

The simplest and by far most commonly used method for joint error detection and correction is to use a concatenation of two codes: a cyclic redundancy check (CRC) error detection code to provide error detection on the information bits, and an error correction code to provide error correction on both the information bits and the CRC bits. Thus, the use of a CRC generally provides for the detection of any errors that remain after error correction. This method does not use a single code and a decoder which can both correct and detect errors. This method does not offer the advantage of error detection without the overhead of a CRC, and does not base both the correction and detection on the soft inputs (a CRC accepts only hard inputs), when soft inputs are available.

(24,12) Golay code encoders and decoders based on the non-binary hexacode have been used in the communication systems for error handling. The family of hexacode-based Golay decoders is very valuable because of the low complexity involved in soft-decision decoding of the popular (24,12) Golay code. The hexacode-based Golay decoders can also accept hard inputs, and are less complex than other hard-decision Golay decoders. The drawback of the hexacode-based Golay decoders is that the Golay code must be represented in a very particular format. Encoding of information packets to be decoded with a hexacode-based Golay decoder is accomplished by a multi-level hexacode-based Golay encoder, as described in a paper by O. Amrani, Y. Be'ery, A, Vardy, F. Sun, and H. van Tilborg entitled: "The Leech lattice and the Golay code: Bounded Distance Decoding and Multi-level Constructions", IEEE Trans. Inform. Theory, Vol. IT-40, pp. 1030–1043, July 1994. The multi-level Golay encoder is non-systematic, such that the input bits to the encoder do not appear within the output bits of the encoder. Non-systematic encoders cause a slightly worse decoded information bit error rate (BER) than systematic encoders due to error propagation.

Presently, the hexacode-based Golay decoders are used only for error correction. Thus there is a need for a communication system that provides for combination of error detection and error correction utilizing hexacode-based Golay decoders.

DETAILED DESCRIPTION OF A PREFERRED EMBODIMENT

Figure 1:
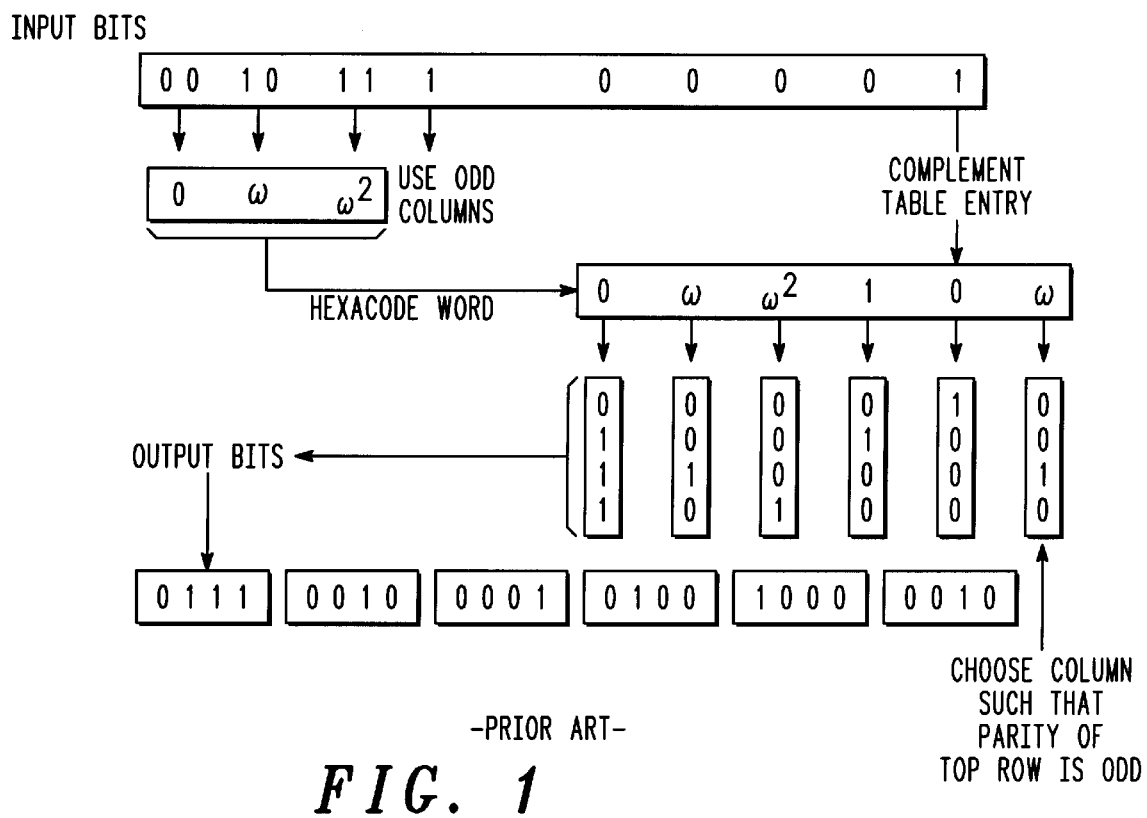
FIG. 1 is a flow diagram of a conventional mapping of 12 bits onto 24 bits using a hexacode-based multi-level Golay encoder.

The present invention provides for efficient correction and detection of input digital signal errors over a communications channel. The present invention in part utilizes a hexacode-based multi-level Golay encoder in combination with a hexacode-based Golay decoder to provide error correction and detection over the communications channel. Both of the hexacode-based multi-level Golay encoder and hexacode-based Golay decoder are based on a formulation referred to as an extended Golay code. The extended Golay code can be characterized as a (24,12) code consisting of all 4×6 binary matrices such that the following three conditions hold:
1. The parity of all the columns is the same. (All the columns have either an even or odd number of 1's.)
2. The parity of the columns equals the parity of the top row.
3. The projection of the 4×6 binary matrix onto a 1×6 non-binary array is based on a (6,3) linear code known as the hexacode. The characters of the hexacode are derived from the Galois field $GF\{4\}=\{0,1,\omega,\omega^2\}$. Multiplication and addition tables for $GF\{4\}$ and a systematic generator matrix for the hexacode are shown hereinbelow:

Generator matrix for the hexacode $$\begin{bmatrix} 1 & 0 & 0 & 1 & \omega^2 & \omega \\ 0 & 1 & 0 & 1 & \omega & \omega^2 \\ 0 & 0 & 1 & 1 & 1 & 1 \end{bmatrix}$$

Addition and multiplication tables for $\mathcal{GF}(4)$

| + | 0 | 1 | $\omega$ | $\omega^2$ |
|---|---|---|---|---|
| 0 | 0 | 1 | $\omega$ | $\omega^2$ |
| 1 | 1 | 0 | $\omega^2$ | $\omega$ |
| $\omega$ | $\omega$ | $\omega^2$ | 0 | 1 |
| $\omega^2$ | $\omega^2$ | $\omega$ | 1 | 0 |

| × | 0 | 1 | $\omega$ | $\omega^2$ |
|---|---|---|---|---|
| 0 | 0 | 0 | 0 | 0 |
| 1 | 0 | 1 | $\omega$ | $\omega^2$ |
| $\omega$ | 0 | $\omega$ | $\omega^2$ | 1 |
| $\omega^2$ | 0 | $\omega^2$ | 1 | $\omega$ |

For example, using Galois field arithmetic, the data vector $(0\omega\omega^2)$ encodes to the hexacode word $(0\omega\omega^2 1 0\omega)$. A 4×6 Golay code matrix is projected onto a 1×6 array of characters in $GF\{4\}$ by projecting each four bit column onto a single character. If the column is $(\alpha_0\alpha_1\alpha_2\alpha_3)'$, wherein $\alpha_0$ through $\alpha_3$ represent binary values in a column the corresponding character is calculated using the following formula: $0\cdot\alpha_0+1\cdot\alpha_1+\omega\cdot\alpha_2+\omega^2\cdot\alpha_3$. Projecting a column onto a character is a many-to-one mapping. For example, (0 0 0 0)', (1 1 1 1)', (0 1 1 1)', and (1 0 0 0)' all project onto the character "0".

An example of an encoding using a hexacode-based multi-level Golay encoder is described below:

ENCODING EXAMPLE

A hexacode-based multi-level Golay encoder receives 12 input bits and maps the same onto a 24 bit Golay codeword (the contents of a binary 4×6 matrix). The 24 bits of the matrix are then read out into the channel columnwise. Of the 12 input bits, bits 1 to 6 are used to select a hexacode word. Since the non-binary characters of $GF\{4\}$ can be represented by two bits each, these six bits specify three elements of $GF\{4\}$. The (6,3) hexacode is utilized to take these three characters and produce a six character hexacode word. For example, if the first six input bits are (00, 10, 11), the corresponding three characters are $(0\omega\omega^2)$, given that 00=0, 01=1, 10=$\omega$, and 11=$\omega^2$. Using the generator matrix of the hexacode, $(0\omega\omega^2)$ is mapped to the hexacode word having six characters $(0\omega\omega^2 1 0\omega)$. The six characters are used to generate the six four-bit columns of the Golay code matrix, such that condition 3 of the definition of the extended Golay code described above holds. That is, each four-bit column must project onto its hexacode word character. In general, there are four possible columns with which each character can be replaced, since four different columns will project onto a single character. In terms of condition 3 of the extended Golay code definition described hereinbefore, any of the four columns may be used. In order to satisfy conditions 1 and 2, however, the remaining six input bits of the twelve input bits are used to make sure that all the columns used have either even or odd parity, and that the top row has the same parity as the columns. For example, it should be appreciated that the following series of bits: (0 0 0 0)', (1 1 1 1)', (0 1 1 1)', and (1 0 0 0)' in each column, all project onto the character "0". It should be noted that two of the possible columns have even parity, and the other two have odd parity. Also, the two even columns are complements of each other, as are the two odd columns. The above-mentioned conditions are also applicable when mapping characters 1, $\omega$, and $\omega^2$. Thus, input bit 7 is used to determine if all the columns will have even (i.e., bit 7=0) or odd (i.e., bit 7=1) parity. This guarantees that condition 1 of the extended Golay code definition will be satisfied. Each of the six characters can be represented by only two possible columns. Input bits 8 through 12 are used to determine which of the two remaining columns is preferred for the first five characters in the hexacode word. Input bits 8 through 12 are referred to as the "preference bits". The last character of the hexacode word must be represented by a column which provides the top row of the 4×6 matrix to have the same parity as the columns, as dictated by the values of bit 7, namely 1 or 0. A simple encoding table depicting the series of the binary values that correspond to the non-binary hexacode characters is shown in the TABLE A below:

TABLE A

| hexacode character | 0 | 1 | $\omega$ | $\omega^2$ | 0 | 1 | $\omega$ | $\omega^2$ |
|---|---|---|---|---|---|---|---|---|
| | 0 | 0 | 0 | 0 | 0 | 0 | 0 | 0 |
| | 0 | 0 | 1 | 1 | 1 | 1 | 0 | 0 |
| | 0 | 1 | 0 | 1 | 1 | 0 | 1 | 0 |
| | 0 | 1 | 1 | 0 | 1 | 0 | 0 | 1 |
| | even (bit 7 = 0) | | | | odd (bit 7 = 1) | | | |

For a given hexacode character (0, 1, $\omega$, and $\omega^2$), TABLE A provides for the determination of which column to be used. In determining which column to use for each hexacode character, the preference bit corresponding to the column must be considered. The above table is prepared with the assumption that the preference bit is "0"; however, when the bit signifying the preference bit is "1", then the complement of the column represented in the table is chosen as representation of the hexacode character.

For example, the input vector (001011100001) is encoded as shown in the flow diagram shown in FIG. 1. The multi-level encoding construction shown in FIG. 1 satisfies the three conditions of the extended Golay code definition. The first six input bits are used to represent 3 characters from GF{4}. These three characters are used to produce a 6 character hexacode word. Each character of the hexacode word will be used to produce a four bit column of the Golay code represented as a 4×6 matrix. Input bit 7 is a "1", so each column will be an odd representation of the corresponding character. Input bit 8 is a "0", so the preference of the first column (output bits 1 to 4) is "0" and the column selected is (0 1 1 1)'. Input bit 9 is a "0", so the preference of the second column (output bits 5 to 8) is "0" and the column selected is (0 0 1 0)'. Input bit 10 is a "0", so the preference of the third column (output bits 9 to 12) is "0" and the column selected is (0 0 0 1)'. Input bit 11 is a "0", so the preference of the fourth column (output bits 13 to 16) is "0" and the column selected is (0 1 0 0)'. Input bit 12 is a "1", so the preference of the fifth column (output bits 17 to 20) is "1" and the column selected is (1 0 0 0)'. The parity of the top row of the Golay code matrix must be odd by condition 2, so the preference of the sixth column (output bits 21 to 24) is "0" and the column selected is (0 0 1 0)'.

The hereinbefore described hexacode-based multi-level Golay encoder is not a systematic construction wherein the 12 input bits also appear as part of the 24 output bits. Since the above-discussed Golay code construction is non-systematic, the decoded information bit error probability can be higher than that of a systematic Golay code. However, this type of construction of the Golay code provides significant advantages in performance and complexity when decoded with a hexacode-based Golay decoder.

Figure 2:
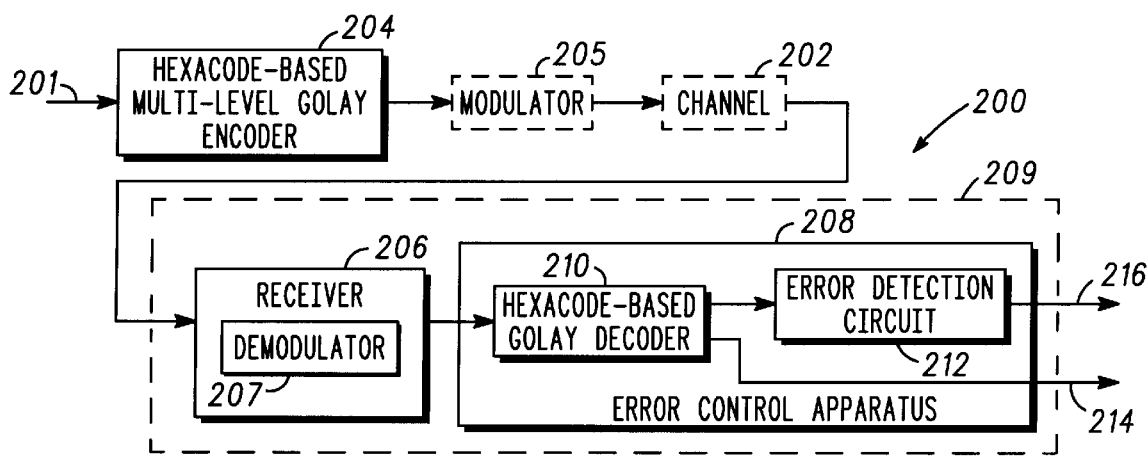
FIG. 2 is a block diagram representation of an embodiment of an error control system in accordance with the present invention.

FIG. 2 is a representation of a block diagram of an embodiment of an error control system in accordance with the present invention. The error control system 200 provides for the detection and correction of errors in the transmission of input data signals 201 over a communication channel 202. The error control system 200 includes a hexacode-based multi-level Golay encoder 204 adapted to receive input data signals and generate Golay encoded data signals, a receiver 206 adapted to receive the Golay encoded data signals and to generate values defining the Golay encoded data signals, an error control apparatus 208 including a hexacode-based Golay decoder 210 adapted to receive the values defining the Golay encoded data signals and to generate both a plurality of metrics associated with the Golay encoded data signals and a estimate of the input data signals 214, and an error detection circuit 212 coupled to the hexacode-based Golay decoder 210 for comparing the plurality of metrics and providing an error detection flag 216.

The receiver 206 and the error control apparatus 208 of the present invention can be implemented in various electronic devices such as subscriber units/phones 209, radio receivers, and the like.

The receiver 206 generally comprises a demodulator 207, wherein the demodulator 207 demodulates the received Golay encoded data signals and generates either hard or soft values defining/representing the received Golay encoded data signals. It should be noted that the Golay encoded data signals are modulated using a modulator 205 for transmission over the channel 202. In the preferred embodiment of the present invention, it is contemplated that the values defining/representing the Golay encoded data signals generated by the demodulator 207 are soft values. According to the present invention, the hexacode-based Golay decoder 210 of the error control apparatus 208 generates one-hundred and twenty-eight metrics, two each for the sixty-four hexacode words. As is known in the art, for each hexacode word, one of the generated metrics is even (corresponding to an even codeword), whereas the other generated metric is odd (corresponding to an odd codeword). It should be noted that the terms "odd" and "even" refer to the parity (number of 1's) as per the conditions 1 and 2 set forth above in the definition of extended Golay code. The error detection circuit 212 coupled to the hexacode-based Golay decoder 210 receives the generated metrics and provides an error detection flag 216 according to a predetermined function. In the preferred embodiment of the present invention, it is contemplated that the predetermined function includes a comparison between the plurality of metrics, generated by the hexacode-based Golay decoder 210, by determining a difference between a largest even metric and a largest odd metric, and subsequently measuring the difference against a predetermined threshold level. Hence, in the event the aforementioned difference is smaller than the threshold level then the error detection flag 216 is generated. It should be noted that the error detection flag 216 may be utilized by an error handling component (not shown). Alternatively, the predetermined function may include a comparison of the plurality of metrics and determining whether a predetermined number of the even metrics are equal to a largest even metric. Furthermore, the predetermined function may include a comparison of the plurality of metrics and determining whether a predetermined number of the odd metrics are equal to a largest odd metric. As a further alternative, the predetermined function may include a comparison of the plurality of metrics by determining a difference between a first largest metric and a second largest metric, and subsequently measuring the difference against a predetermined threshold level.

According to the present invention, the hexacode-based Golay decoder 210 of the error control apparatus 208 further generates the estimate of the input data signals, namely the input data signals 201 that are originally supplied to the hexacode-based multi-level Golay encoder 204. Hence, the error handling component (not shown) receiving the combination of the error detection flag 216 and the estimate of the input data signals 214 may effect an appropriate error handling operation. In the preferred embodiment of the present invention, the error detection flag is soft-valued.

Figure 3:
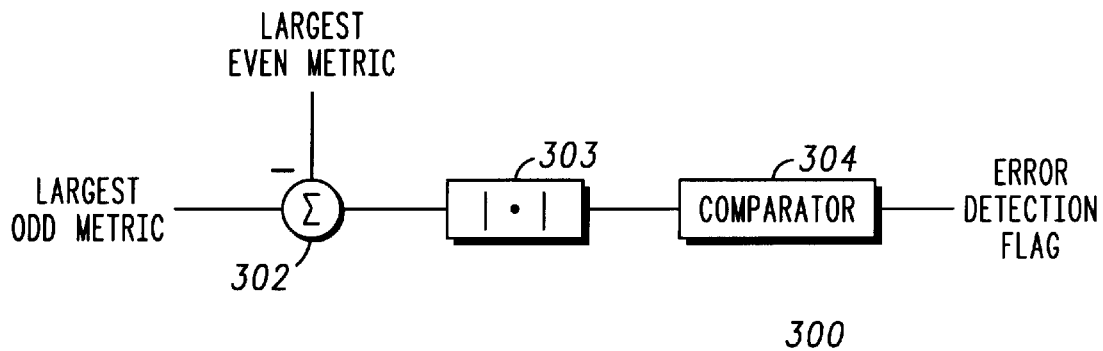
FIG. 3 is a schematic representation of an error detection circuit of an error control apparatus in accordance with the present invention.

FIG. 3, numeral 300, is a schematic representation of the error detection circuit 212 of the error control apparatus 208 in accordance with the present invention. Referring to FIG. 3, a largest even metric and a largest odd metric from the hexacode-based Golay decoder 210 are provided to an Adder 302 wherein the largest even metric is subtracted from the largest odd metric and the result is provided to an absolute value element 303 in order to obtain the absolute value of the difference between the largest even metric and the largest odd metric. The difference between the largest even metric and the largest odd metric is compared against a threshold value using a comparator 304 and when the absolute value of the difference is less than the threshold value, then the error detection flag 216 is provided to the error handling component (not shown). It is to be appreciated that various embodiments of the error detection circuit 212 may be utilized in order to achieve a desired error detection result.

Figure 4:
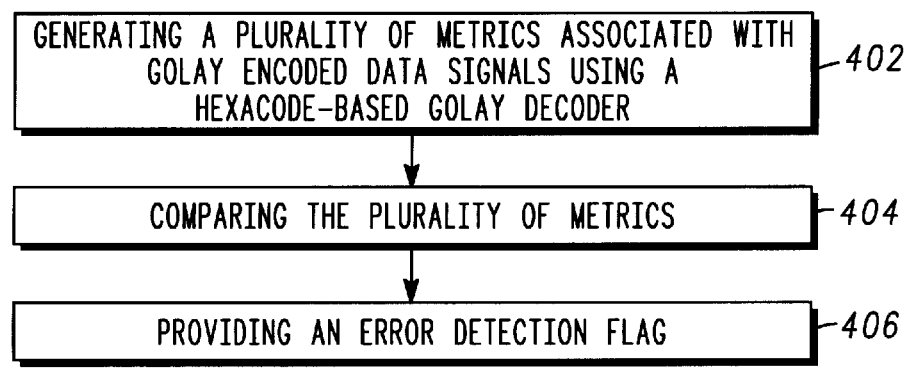
FIG. 4 is a flow chart showing one embodiment of steps in accordance with the present invention.

FIG. 4, numeral 400, is a graphic representation of one embodiment of steps of a method in accordance with the present invention. The method includes the steps of: a) generating a plurality of metrics associated with Golay encoded data signals using a hexacode-based Golay decoder (402); b) comparing the plurality of metrics (404); and c) providing an error detection flag (406).

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

I claim:

1. A method of error detection of soft valued Golay encoded data signals, comprising the steps of:

generating a plurality of even metrics and a plurality of odd metrics associated with Golay encoded data signals using a hexacode-based Golay decoder;

comparing the plurality of metrics and producing a soft metirc;

measuring the soft metric against a predetermined soft threshold level; and providing an error detection flag.

2. The method of claim 1, wherein the comparing step includes the steps of:

determining a difference between a largest even metric and a largest odd metric.

3. The method of claim 1, wherein the comparing step includes the step of:

determining whether a predetermined number of the even metrics are equal to a largest even metric.

4. The method of claim 1, wherein the comparing step includes the step of:

determining whether a predetermined number of the odd metrics are equal to a largest odd metric.

5. The method of claim 1, wherein the comparing step includes the steps of:

determining a difference between a first largest metric and a second largest metric.

6. The method of claim 1, wherein the error detection flag is soft valued.

7. An error control apparatus for providing error detection and an estimate of input data signals received by a hexacode-based multi-level Golay encoder, wherein the hexacode-based multi-level Golay encoder generates soft valued Golay encoded data signals, comprising:

a hexacode-based Golay decoder adapted to receive values defining the Golay encoded data signals and to generate an estimate of the input data signals and a plurality of even metrics and a plurality of odd metrics associated with the Golay encoded data signals; and an error detection circuit coupled to the hexacode-based Golay decoder for comparing the plurality of metrics and producing a soft metric, measuring against a predetermined soft threshold level, and providing an error detection flag.

8. The error control apparatus of claim 7, wherein the error detection flag is soft valued.

9. An error control system, comprising:

a hexacode-based multi-level Golay encoder adapted to receive input data signals and generate soft valued Golay encoded data signals, a receiver adapted to receive the Golay encoded data signals and to generate values defining the Golay encoded data signals;

a hexacode-based Golay decoder adapted to receive the values defining the Golay encoded data signals and to generate an estimate of the input data signals and a plurality of even metrics and a plurality of odd metrics associated with the Golay encoded data signals; and an error detection circuit coupled to the hexacode-based Golay decoder for comparing the plurality of metrics thereby producing a soft metric, measuring against a predetermined soft threshold level, and providing an error detection flag.

10. The error control system of claim 9, wherein the error detection flag is soft valued.

11. The error control system of claim 9, wherein the receiver comprises a demodulator.

12. A phone for providing error detection and an estimate of input data signals received by a hexacode-based multi-level Golay encoder, wherein the hexacode-based multi-level Golay encoder generates soft valued Golay encoded data signals, comprising:

a receiver adapted to receive the Golay encoded data signals and to generate values defining the Golay encoded data signals;

a hexacode-based Golay decoder adapted to receive the values defining the Golay encoded data signals and to generate an estimate of the input data signals and a plurality of even metrics and a plurality of odd metrics associated with the Golay encoded data signals; and an error detection circuit coupled to the hexacode-based Golay decoder for comparing the plurality of metrics thereby producing a soft metric, measuring against a predetermined soft threshold level, and providing an error detection flag.

13. The error control apparatus of claim 12, wherein the error detection flag is soft valued.

\* \* \* \* \*